(12) United States Patent
Huber

(10) Patent No.: US 6,462,989 B1
(45) Date of Patent: Oct. 8, 2002

(54) TECHNIQUE FOR LOCALLY REDUCING EFFECTS ON AN ANALOG SIGNAL DUE TO CHANGES ON A REFERENCE BUS IN AN INTEGRATED CIRCUIT

(75) Inventor: Brian W. Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/870,088

(22) Filed: May 30, 2001

(51) Int. Cl.[7] ............................................... G11C 16/06
(52) U.S. Cl. ............................ 365/185.23; 365/185.18; 365/189.09; 365/230.06
(58) Field of Search ................... 365/230.06, 230.01, 365/226, 185.23, 185.18, 189.09; 361/111

(56) References Cited

U.S. PATENT DOCUMENTS 4,563,660 A * 1/1986 McNeilly ..................... 333/181
5,822,166 A * 10/1998 Massie ......................... 361/111
5,844,425 A * 12/1998 Nguyen et al. ................ 326/58
5,963,057 A * 10/1999 Schmitt et al. .............. 326/103

* cited by examiner

*Primary Examiner*—David Nelms
*Assistant Examiner*—Tu-Tu Ho
(74) *Attorney, Agent, or Firm*—Fletcher, Yoder & Van Someren

(57) ABSTRACT

A technique is provided for reducing changes in the amount of a bias voltage that is applied to a device in an integrated circuit due to local changes on a bus providing the reference for the bias voltage signal. Local transients on the reference bus may occur due to the inductance of the integrated circuit packaging. To prevent the local transients from affecting the amount of bias applied to a device, the local bias signal is allowed to move common mode with the local reference signal by isolating the local bias signal from the bias source. The technique also provides for disabling the isolation of the local bias signal from the bias source in response to a control signal.

36 Claims, 4 Drawing Sheets

TECHNIQUE FOR LOCALLY REDUCING EFFECTS ON AN ANALOG SIGNAL DUE TO CHANGES ON A REFERENCE BUS IN AN INTEGRATED CIRCUIT

BACKGROUND OF THE INVENTION

1. Field of the Invention

The present invention generally relates to integrated circuits in which an analog signal is distributed to multiple components and, more particularly, to locally reducing the effects on the analog signal due to voltage changes on a bus providing the reference for the analog signal.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Integrated circuits typically include multiple signals which are distributed on a semiconductor substrate to various types of components, such as logic circuitry, input circuitry, output circuitry, etc. Such signals include analog signals that may be used to bias some of the components and which typically are referenced to a voltage bus (e.g., a ground) provided on the semiconductor substrate. The reference voltage bus may have a variety of different topologies and may be configured as a shared bus on the substrate to which the various components connect. Alternatively, the reference voltage bus may be configured as multiple independent electrical paths from each of the components to pads on the substrate which are connected to an external reference voltage source.

Many integrated circuit components biased by the analog signal may generate output signals which are particularly sensitive to changes in the bias voltage. For example, integrated circuits, such as memory devices (e.g., SRAMs, DRAMs) typically include output drivers to drive output signals onto a data bus. Many such output drivers include open-drain or open-collector drive elements. When a logical HIGH level data signal is provided on the data bus, the output driver element (e.g., a FET, a BJT, etc.) is in a non-conductive state. To provide a logical LOW level signal on the data bus, the driver element is placed in a conductive state such that an output current flows on the data bus.

The amount of current provided by a driver element generally is dependent on the amount of bias voltage applied to that driver element. Thus, variations of the reference voltage on the reference bus can cause corresponding changes in the output current provided by a driver element. Such variations may be due to resistive drops on the voltage reference bus or inductive effects which cause transients on the reference bus when the driver element switches between conductive and non-conductive states. If the bias voltage signal applied locally to a driver element does not move common mode with the variations on the reference bus, the amount of bias voltage (i.e., the difference between the bias voltage signal and the reference bus) may vary locally at the driver element. Decreases in the local bias voltage at a particular driver element may lead to decreases in the amount of current the particular driver element can provide to the data bus. Increases in the local bias voltage at a particular driver element can steal charge away from other driver elements, thus decreasing the amount of current the other driver elements can provide to the data bus. Weak data signals on the data bus that may result due to the decreased amount of current provided by a driver element potentially may lead to data errors.

Changes in the amount of bias voltage applied locally to a component may be reduced by addressing circuit layout and lead lengths to minimize the parasitic inductance of the integrated circuit package which can cause voltage changes on the reference bus. However, the parasitic inductance cannot be eliminated completely. Thus, to further reduce changes in the amount of bias voltage applied locally to a component, the size of the reference bus may be increased (i.e., the resistance decreased) such that voltage changes on the reference bus are not large enough to impact the output current provided by a driver element. Alternatively, gridding of the reference bus on the substrate may be increased to further reduce voltage changes. Such solutions may not be particularly attractive, however, as they can lead to significant increases in the amount of bussing, thus increasing the size of the integrated circuit. For applications in which minimization of circuit size is desirable, increasing the size of the bus or the amount of bus gridding may not be attractive alternatives.

The present invention may address one or more of the problems set forth above.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
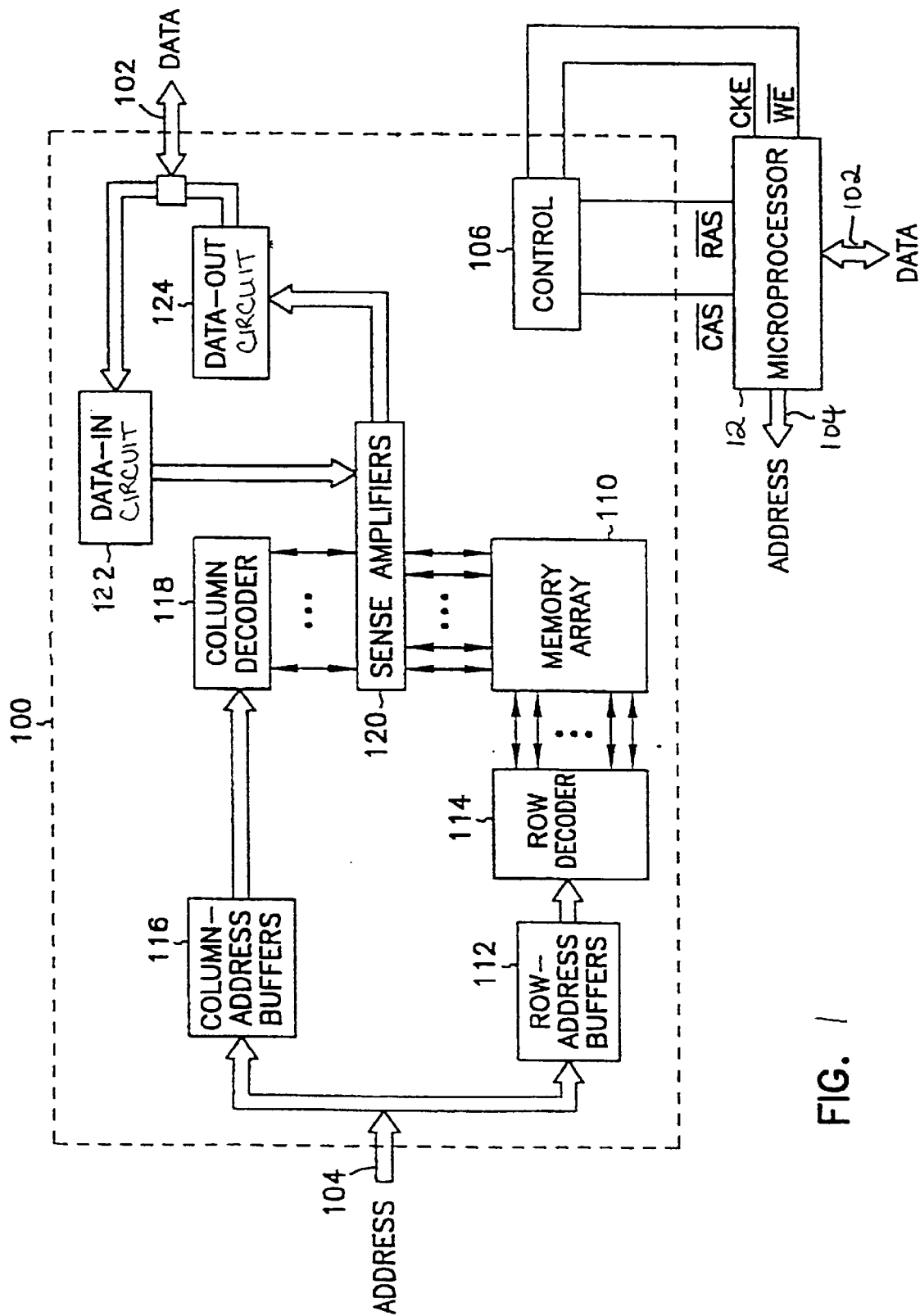
FIG. 1 is a block diagram depicting an exemplary embodiment of a memory circuit, such as a DRAM.

Turning now to the figures and initially referring to FIG. 1, a block diagram depicting an exemplary embodiment of a memory circuit 100, such as a dynamic random access memory (DRAM) built on a semiconductor substrate, is illustrated. The description of the DRAM 100 has been simplified for illustrative purposes and is not intended to be a complete description of all features of a DRAM. The present system is not limited to DRAMs, and is equally applicable to other random access memory devices, as well as other integrated circuit devices having an analog signal distributed to various components on a semiconductor substrate. Those skilled in the art will recognize that a wide variety of devices may be used in the implementation of the present invention. Further, those skilled in the art will recognize that the following discussion of the invention, as it may be implemented in a DRAM, is intended merely to facilitate an understanding of the invention.

Control, address, and data information provided over a memory bus are represented by individual inputs to the DRAM 100. These individual representations are illustrated by a data bus 102, address lines 104, and various discrete lines directed to control logic 106. As is known in the art, the DRAM 100 includes a memory array 110, which comprises rows and columns of addressable memory cells. Each memory cell in a row is coupled to a word line. Additionally, each memory cell in a column is coupled to a bit line. Each cell in the memory array 110 typically includes a storage capacitor and an access transistor as is conventional in the art.

The DRAM 100 interfaces with, for example, a microprocessor 12 through address lines 104 and data lines 102. Alternatively, the DRAM 100 may interface with a DRAM controller, a microcontroller, a chip set, or other electronic system. The microprocessor 12 also may provide a number of control signals to the DRAM 100. Such signals may include row and column address strobe signals RAS/ and CAS/, a write enable signal WE/, a clock enable signal CKE, and other conventional control signals. The control logic 106 controls the many available functions of the DRAM 100. In addition, various other control circuits and signals not detailed herein contribute to the DRAM 100 operation as known to those of ordinary skill in the art.

A row address buffer 112 and a row decoder 114 receive and decode row addresses from row address signals provided on the address lines 104. Each unique row address corresponds to a row of cells in the memory array 110. The row decoder 114 typically includes a word line driver, an address decoder tree, and circuitry which translates a given row address received from row address buffers 112 and selectively activates the appropriate word line of the memory array 110 via the word line drivers.

A column address buffer 116 and a column decoder 118 receive and decode column address signals provided on the address lines 104. The column decoder 118 also determines when a column is defective and the address of a replacement column. The column decoder 118 is coupled to sense amplifiers 120. The sense amplifiers 120 also receive inputs from complementary pairs of bit lines of the memory array 110.

The outputs of the sense amplifiers 120 are coupled to data-in (i.e., write) circuitry 122 and data-out (i.e., read) circuitry 124. During a write operation, the data bus 102 provides data to the data-in circuitry 122. The sense amplifier 120 receives data from the data-in circuitry 122 and stores the data in the memory array 110 as a charge on a capacitor of a cell at an address specified on the address line 104. In one embodiment, the data bus 102 includes eight data lines to implement an 8-bit data bus carrying data at 400 MHz or higher.

During a read operation, the DRAM 100 transfers data (e.g., 8 bits) to the microprocessor 12 from the memory array 110. During a pre-charge operation, complementary bit lines for the accessed cell are equilibrated to a reference voltage provided by an equilibration circuit and a reference voltage supply. The charge stored in the accessed cell is then shared with the associated bit lines. The sense amplifier 120 detects and amplifies a difference in voltage between the complementary bit lines. Address information received on address lines 104 selects a subset of the bit lines and couples them to complementary pairs of input/output (I/O) wires or lines. The I/O wires pass the amplified voltage signals to the data-out circuitry 124, which includes a driver for each data line to drive the output data signals out to the data bus 102.

Figure 2:
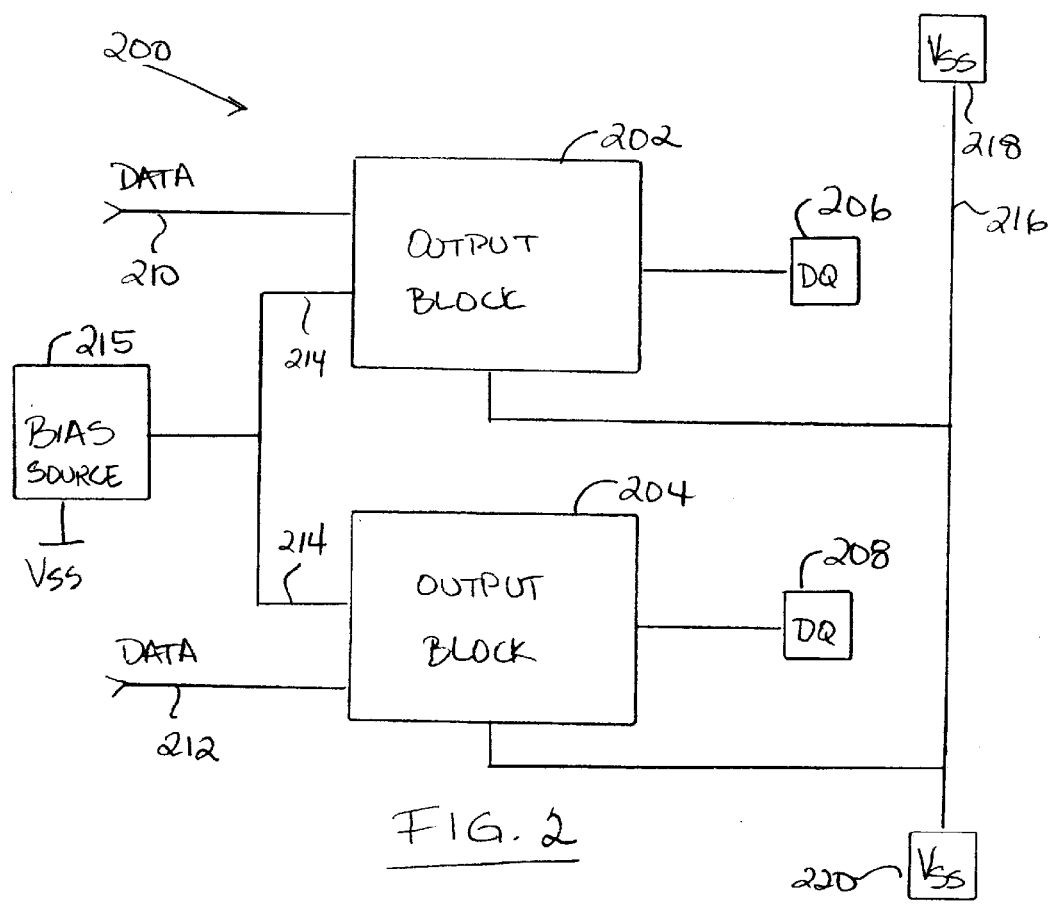
FIG. 2 illustrates a block diagram of a partial exemplary output driver circuit that may be implemented in the memory circuit of FIG. 1.

FIG. 2 illustrates a block diagram of a partial exemplary driver circuit 200 that may be implemented in the data-out circuitry 124 of the DRAM 100 of FIG. 1. In the diagram illustrated, the driver circuit 200 includes output blocks 202 and 204, which include driver elements to drive output data signals to DQ outputs 206 and 208, respectively. The DQ outputs 206 and 208 represent pads on a semiconductor substrate which may be connected to a data bus 102 external of the integrated circuit package. The data signals on the data bus 102 then may be transmitted to other devices (e.g., microprocessor 12) in a processing system of which the DRAM 100 is a part. Although only two output blocks 202 and 204 are shown in FIG. 2, the data-out circuit 124 may include a different number of output blocks and, in one embodiment, includes nine output blocks.

The output blocks 202 and 204 receive input data signals via data inputs 210 and 212, respectively. In the particular embodiment illustrated, the data signals on inputs 210 and 212 represent data read from the memory array 110 via the sense amplifiers 120. In addition to the data signals received on inputs 210 and 212, the output blocks 202 and 204 receive a bias voltage signal 214 from an appropriate bias voltage source 215. The bias voltage signal 214 may be used to bias various components within the output block 202, such as a transistor gate, a differential amplifier, etc. The bias voltage 214 is an analog voltage that is referenced to a voltage (e.g., ground ($V_{SS}$)) on a bus 216 on the semiconductor substrate. In the embodiment illustrated in FIG. 2, the bus 216 extends between bus pads 218 and 220, which are connected to a reference voltage source external of the integrated circuit package. The bus 216 is "shared" bus, meaning that various circuitry (e.g., output blocks 202 and 204) connected to the bus 216 share a common electrical path on the semiconductor substrate to the external reference voltage source.

The bus 216 has resistive characteristics which, depending on the physical size of the bus, may cause changes in the reference voltage on the bus 216. Because the bias voltage signal 214 applied locally to each of output blocks 202 and 204 derives its reference from bus 216, voltage changes on the bus 216 at the point of application (i.e., the local voltage on the reference bus 216 at the output block 202 or 204 differs from the voltage on the reference bus 216 at the source of the reference voltage) may impact the amount of bias voltage applied locally to each of output blocks 202 and 204. For example, if the bus 216 is a shared bus, then changing output current patterns on the shared bus 216 may introduce corresponding resistive voltage drops on the bus 215, which impact the magnitude of the reference voltage local to the output block. Similarly, the parasitic inductance of the integrated circuit package may cause di/dt voltage transients on the bus 216 due to the switching of the various driver elements.

Figure 3:
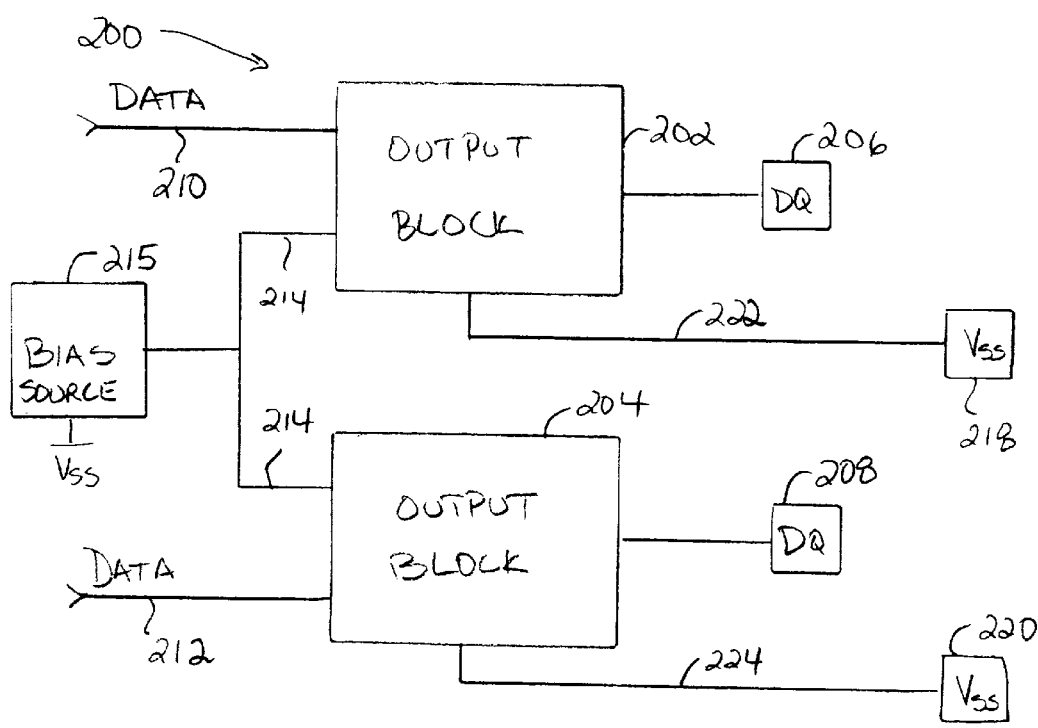
FIG. 3 illustrates a block diagram of alternative exemplary embodiment of a output driver circuit that may be implemented in the memory circuit of FIG. 1.

FIG. 3 illustrates a block diagram of an alternative exemplary embodiment of the driver circuit 200. In this embodiment, each of output blocks 202 and 204 have independent electrical paths 222 and 224, respectively, to an external reference voltage source via pads 218 and 220, respectively. The "non-shared" bus topology illustrated in FIG. 3 may be advantageous in applications in which it may be desired to avoid resistive voltage variations on the reference bus due to sharing of the bus by multiple components.

Regardless of whether the reference bus 216 has a shared or non-shared topology, inductive effects due to the packaging of the integrated circuit may cause transient, local voltage changes on the bus 216 at the point of application to the output blocks 202 and 204. If the bias voltage signal 214 applied locally to the output block 202 or 204 does not move (i.e., the local bias voltage signal 214 remains constant with respect to the bias voltage at the bias source 215), then the amount of bias voltage (i.e., the difference between the bias voltage signal 214 and the reference bus) may vary locally at the output block 202 or 204. In certain embodiments, the amount of output current that can be provided by an output block 202 or 204 (i.e., the drive strength) is related to the amount of bias voltage applied to the output block 202 or 204. Thus, variations in the amount of bias voltage may cause corresponding changes in the amount of output current provided by any particular output block 202 or 204. If the amount of current varies with respect to a target value, weak data signals on the data bus 102 may result, which can lead to potential errors in the transmission of data to other devices in communication with the memory device 100.

A technique for reducing inductive effects on the amount of bias voltage applied locally to an output block 202 or 204 involves isolating the bias voltage signal 214 at the point at which it is applied to the bias-sensitive component (i.e., the local bias voltage signal), from the bias voltage source 215 and capacitively coupling the local bias voltage signal 214 to the local reference voltage signal, thus allowing the local bias signal 214 to move common mode with the local reference voltage signal. A block diagram illustrating an exemplary embodiment of an output block 202 having circuitry for implementing such a technique is provided in FIG. 4.

Figure 4:
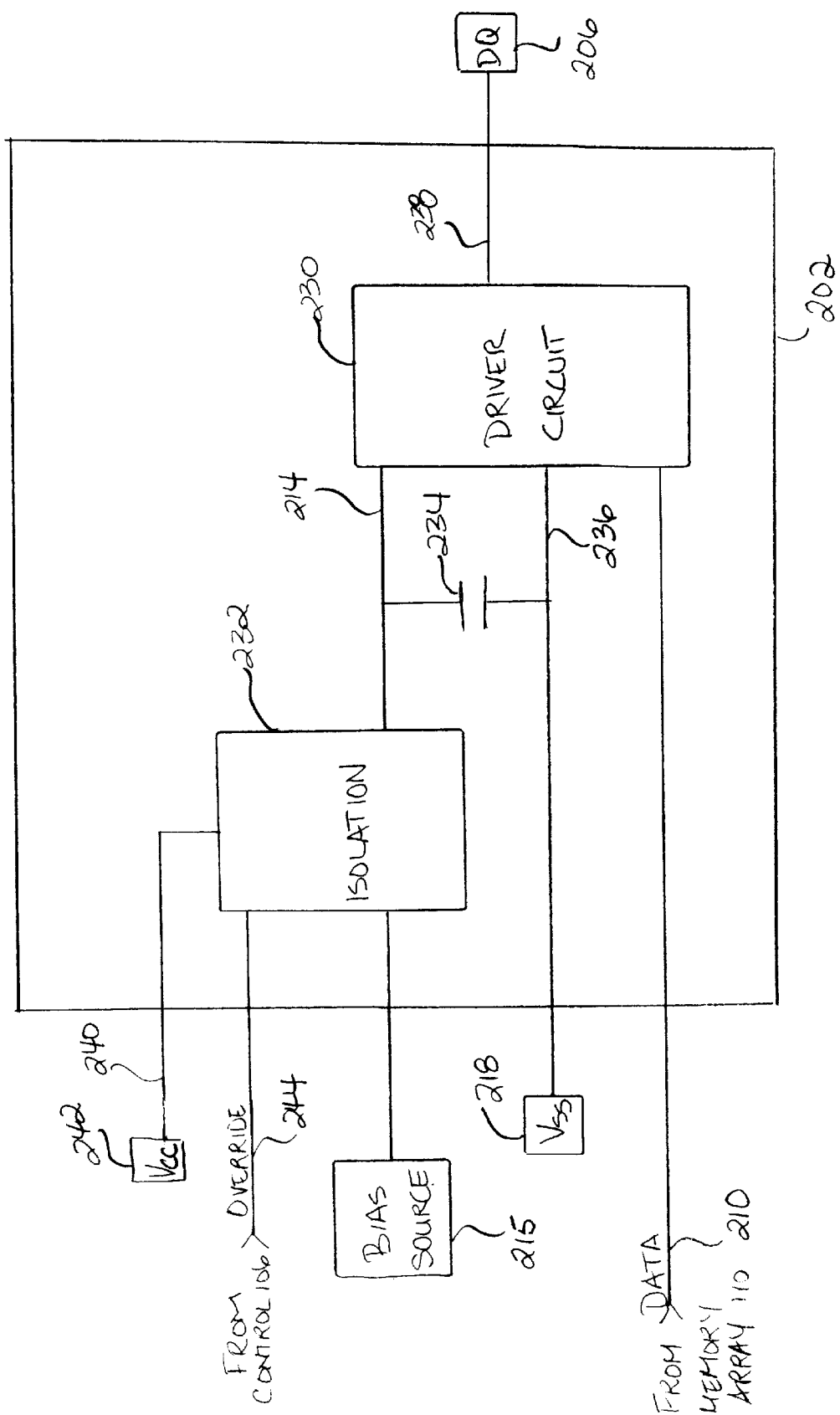
FIG. 4 illustrates a block diagram of an exemplary embodiment of an output driver circuit of FIGS. 2 or 3, which further includes isolation circuitry to isolate the local bias signal from the bias source in accordance with the invention.

The output block 202 illustrated in FIG. 4 includes a driver circuit 230, an isolation circuit 232, and a capacitor 234. The driver circuit 230 receives the input data signal 210 representative of data read from the memory array 110 and, in response thereto, drives a data output signal 238 onto the DQ output pad 206 on the semiconductor substrate. The DQ output pad 206 is connected, external of the integrated circuit package, to the data bus 102.

The driver circuit 230 also receives a local reference voltage signal 236 from a reference bus. The reference bus may be either the shared bus 216 connected to an external reference voltage source via the $V_{SS}$ pad 218 on the semiconductor substrate, or may be the independent electrical signal path 222 provided from the output block 202 to the $V_{SS}$ pad 218. In any event, due to resistive and inductive effects, the local reference voltage signal 236 may have a magnitude different than that of the reference voltage signal at either the pad 218 or the external reference voltage source.

The local bias voltage signal 214 also is provided to the driver circuit 230. The local bias voltage signal 214 is isolated from the source 215 of the bias voltage (e.g., an internal or external voltage generator) by the isolation circuit 232. The local bias signal 214 is referenced to the local reference voltage signal 236 and is capacitively coupled to the local reference voltage signal 236 by the capacitor 234.

In addition to the voltage from the bias source 215, the isolation circuit 232 receives a voltage signal 240 ($V_{CC}$) from a voltage bus connected to a $V_{CC}$ pad 242, which may be connected to an external voltage source. The voltage signal 240 may be used to bias various components and/or to provide a supply voltage to various components. In the embodiment illustrated in FIG. 4, the isolation circuit 232 may also receive various control signals from control circuit 106. The control signals may include, for example, an isolation override signal 244, which may used to override the isolation circuit 232, thus connecting the local bias voltage signal 214 directly to the bias source 215, as desired.

The isolation circuit 232 includes a resistive isolation element sized to cooperate with the capacitor 234 such that the local bias voltage signal 214 may move common mode with the local reference voltage signal 236 when voltage transients are introduced on the local reference voltage signal 236. In the embodiment illustrated, such voltage transients typically result from the switching of the driver circuits (e.g., driver circuit 230) in the various output blocks 202 and 204 of the data output circuitry 124 in the memory device 100.

Figure 5:
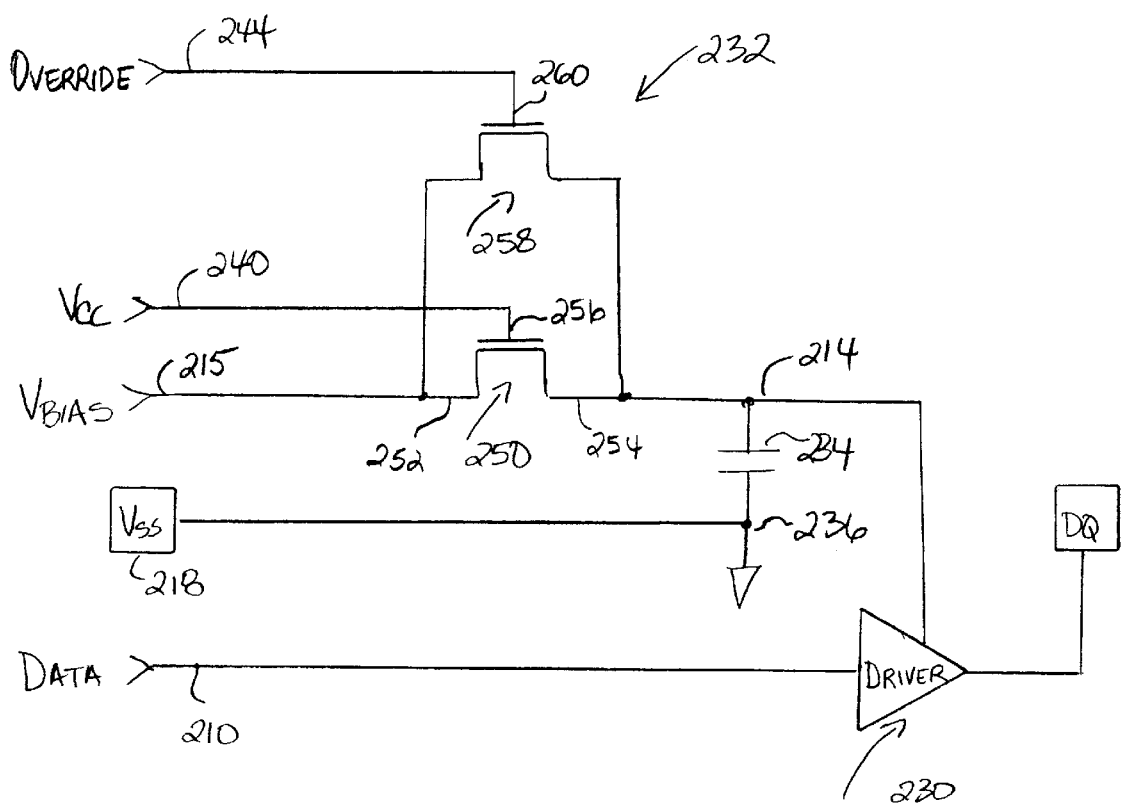
FIG. 5 illustrates an electrical schematic of exemplary isolation circuitry for the output driver circuit of FIG. 4.

FIG. 5 illustrates an electrical schematic of an exemplary embodiment of an isolation circuit 232 coupled to a driver circuit 230. The resistive isolation element of the isolation circuit 232 discussed above is provided by a FET 250. The drain 252 of the FET 250 is connected to the source 215 of the bias voltage, and the source 254 of the FET 250 is coupled to the capacitor 234, which represents the point at which the local bias voltage signal 214 is applied to the driver circuit 230. During normal operation of the driver circuit 230, the FET 250 is placed in a weak conductive state by the voltage signal 240 ($V_{CC}$) applied to its gate 256, such that the local bias voltage signal 214 can move common mode with the local reference voltage signal 236.

The particular sizes of the FET 250 and the capacitor 234 in any particular application could be determined readily by one of ordinary skill in the art having the benefit of this disclosure. In an exemplary embodiment, the capacitor 234 ranges in size from less than 1 pF to about 7 pF. The FET 250 may range in size from a width of 1.2 microns by a length of 0.7 microns to a width of 6.2 microns by a length of 0.25 microns.

An override FET 258 is coupled in parallel with the isolation FET 250 to quickly override the isolation provided by the FET 250 in response to the override control signal 244 applied to its gate 260. Override of the bias voltage signal isolation may be desirable in certain applications. For example, it may be desirable to eliminate the isolation such that certain parameters (e.g., output current provided by the driver element 230) can be calibrated. Such calibration may be performed either during a test situation or in real-time during actual operation of the memory device 100.

The size of the override FET 258 for any particular implementation thus bears a relationship to the size of the isolation FET 250 and the capacitor 234, and would be a matter of design choice readily apparent to one of ordinary skill in the art having the benefit of this disclosure. In an exemplary embodiment, the override FET 258 is a low voltage threshold FET that can be placed in a strong conductive state by the override control signal 244, such that the isolation of the local bias voltage signal 214 from the bias voltage source 215 provided by the FET 250 can be eliminated. Thus, the override FET 258 is sized such that, when enabled, it provides more drive than the isolation FET 250. In an exemplary embodiment, the ratio of the drive strength of the override FET 258 to the drive strength of the isolation FET 250 is approximately 20:1. Thus, in an embodiment in which the capacitor is about 7 pF and the isolation FET 250 is 2.5 microns wide by 0.25 microns long, the override FET 258 may have a width of 50 microns and a length of 0.25 microns. Similarly, in an embodiment in which the capacitor is less than 1 pf and the isolation FET 250 is 1.25 microns wide by 0.7 microns long, the override FET 258 may have a width of 6.2 microns and a length of 0.25 microns.

The foregoing embodiment of the isolation circuit 232 is exemplary only, and it should be understood that the particular configuration of the isolation circuit 232 may vary without departing from the scope of the invention. For example, the isolation provided by the FET 250 could be provided by an appropriately sized resistor or any other element which cooperates with the capacitor 234 in such a manner as to permit the local bias voltage signal 214 to move common mode with the local reference voltage signal 236. Further, the capacitor 234 may be a discrete capacitor or may be parasitic capacitance between traces on the semiconductor substrate. Still further, overriding the isolation provided by the isolation element may be performed by components other than the FET 258. For example, the override component could be implemented as an electrical switch which transitions between closed an open states in response to the override control signal.

Thus, while the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of applying an analog signal to a device in an integrated circuit, the method comprising the acts of:
    applying a local analog signal to a device in an integrated circuit, the local analog signal being referenced to a local reference signal applied to the device;
    isolating the local analog signal from a source of the local analog signal, such that the local analog signal may move common mode with the local reference signal; and
    overriding the isolation of the local analog signal in response to a control signal.

2. The method as recited in claim 1, wherein the local analog signal is capacitively coupled to the local reference signal, and wherein the act of isolating the local analog signal comprises coupling a resistive element between the device and the source of the local analog signal, wherein the resistive element cooperates with a capacitive coupling between the local analog signal and the local reference signal such that the local analog signal moves common mode wit h the local reference signal.

3. The method as recited in claim 2, wherein the resistive element comprises a transistor.

4. The method as recited in claim 2, wherein the capacitive coupling comprises a discrete capacitor.

5. The method as recited in claim 2, wherein the act of overriding the isolation comprises coupling an electrically controllable switch in parallel with the resistive element.

6. The method as recited in claim 5, wherein the electrically controllable switch comprises a transistor, wherein the transistor has a resistance that is less than a resistance of the resistive element.

7. The method as recited in claim 1, wherein the integrated circuit comprises a memory device, and wherein the local analog signal is applied to an output driver of the memory device.

8. The method as recited in claim 7, wherein the memory device is a DRAM.

9. A method of applying a bias signal to an output driver of a memory device, the method comprising the acts of:
    applying a local bias signal to a first output driver of a plurality of output drivers, the local bias signal being referenced to a local reference signal applied to the first output driver, wherein the local reference signal may move with respect to a source of the local reference signal when one or more of the plurality of output drivers transition between conductive and non-conductive states; and
    enabling the local bias signal to move common mode with the local reference signal when the one or more output drivers transition between conductive and non-conductive states.

10. The method as recited in claim 9, comprising the act of disabling the local bias signal from moving common mode with the local reference signal in response to a control signal.

11. The method as recited in claim 9, wherein the act of enabling the local bias signal to move common mode with the local reference signal comprises the act of isolating the local bias signal from a bias source of the local bias signal.

12. The method as recited in claim 11, wherein the act of isolating the local bias signal from the bias source comprises the act of coupling a resistive element between the first output driver and the bias source.

13. The method as recited in claim 12, comprising the act of coupling a electrically controllable switch in parallel with the resistive element to disable the local bias signal from moving common mode with the local reference signal in response to a control signal.

14. The method as recited in claim 13, wherein the resistive element comprises a first transistor, and wherein the electrically controllable switch comprises a second transistor.

15. The method as recited in claim 9, wherein the act of enabling the local bus signal to move common mode with the local reference signal comprises the act of capacitively coupling the local bias signal to the local reference signal.

16. The method as recited in claim 15, wherein the act of capacitively coupling the local bias signal to the local reference signal comprises the act of coupling a capacitor between a bias input and a reference input of the first output driver.

17. The method as recited in claim 9, wherein the memory device is a DRAM.

18. A method of providing an analog signal to a device in an integrated circuit, the method comprising the acts of:
    providing an analog input for a device in an integrated circuit, the analog input for applying to the device an analog signal from an analog source;
    providing a reference input for the device, the reference input for applying to the device a reference signal from a reference source;
    coupling an isolation element between the analog source and the analog input;
    coupling a capacitive element between the analog input and the reference input, wherein the isolation element and the capacitive element cooperate such that the analog signal at the analog input moves common mode with the reference signal at the reference input; and coupling an isolation override element in parallel with the isolation element to selectively override the isolation element, such that the analog signal at the analog input does not move common mode with the reference signal at the reference input.

19. The method as recited in claim 18, wherein the isolation override element is configured to override the isolation element in response to a control signal.

20. The method as recited in claim 18, wherein the integrated circuit comprises a memory device.

21. The method as recited in claim 20, wherein the device comprises an output driver of the memory device.

22. The method as recited in claim 20, wherein the memory device is a DRAM.

23. A memory device, comprising:

a memory array to store data; and a data output circuit to output data from the memory array to a data bus, the data output circuit comprising:

a plurality of drivers to drive the output data onto the data bus, wherein a first driver of the plurality of drivers comprises:

an analog input to receive an analog signal from an analog source;

a reference input to receive a reference signal from a reference source; wherein the reference input is capacitively coupled to the analog input;

an isolation circuit to isolate the analog input from the analog source, such that the analog signal at the analog input can move common mode with the reference signal at the reference input; and an override circuit configured to disable the isolation circuit, such that the analog input is directly coupled to the analog source.

24. The memory device as recited in claim 23, wherein the override circuit disables the isolation circuit in response to a control signal.

25. The memory device as recited in claim 23, comprising a capacitor coupled between the analog input and the reference input.

26. The memory device as recited in claim 23, wherein the isolation circuit comprises a transistor.

27. The memory device as recited in claim 24, wherein the override circuit comprises an electrically controllable switch configured to disable the isolation circuit in response to the control signal.

28. The memory device as recited in claim 27, wherein the electrically controllable switch comprises a transistor.

29. The memory device as recited in claim 23, wherein the memory device is a DRAM.

30. An integrated circuit device, comprising:

a first electrical path to carry an analog signal from an analog source;

a second electrical path to carry a reference signal from a reference source;

an electrical component having an analog input coupled to the first electrical path and a reference input coupled to the second electrical path;

an isolation circuit in series with the first electrical path and coupled between the analog source and the analog input;

a capacitor coupled between the analog input and the reference input; and an override circuit coupled in parallel with the isolation circuit, wherein the isolation circuit cooperates with the capacitor to enable the analog signal at the analog input to move common mode with the reference signal at the reference input, and wherein the override circuit is configured to disable the isolation circuit.

31. The integrated circuit device as recited in claim 30, wherein the override circuit is configured to disable the isolation circuit in response to a control signal.

32. The integrated circuit as recited in claim 30, wherein the second electrical path is a shared bus.

33. The integrated circuit as recited in claim 30, wherein the isolation circuit comprises a transistor.

34. The integrated circuit as recited in claim 30, wherein the override circuit comprises a transistor configured to switch between conductive and non-conductive states in response to the control signal.

35. The integrated circuit as recited in claim 30, wherein the integrated circuit comprises a memory device, and the electrical component comprises an output driver.

36. The integrated circuit as recited in claim 35, wherein the memory device is a DRAM.

* * * * *